United States Patent [19]
Mojaradi et al.

[11] Patent Number: 5,382,826
[45] Date of Patent: Jan. 17, 1995

[54] STACKED HIGH VOLTAGE TRANSISTOR UNIT

[75] Inventors: Mohamad M. Mojaradi, Los Angeles; Tuan A. Vo, Hawthorne, both of Calif.

[73] Assignee: Xerox Corporation, Stamford, Conn.

[21] Appl. No.: 170,848

[22] Filed: Dec. 21, 1993

[51] Int. Cl.⁶ .................. H01L 23/58; H01L 29/76; H03K 17/687
[52] U.S. Cl. .................. 257/489; 257/491; 257/409; 327/427; 327/566
[58] Field of Search ............ 257/488, 489, 491, 409, 257/379, 380, 536, 538, 341; 307/575, 577, 584, 248

[56] References Cited

U.S. PATENT DOCUMENTS

4,288,806  9/1981  Ronen .................. 257/488
4,333,225  6/1982  Yeh .................... 257/341

Primary Examiner—Steven Ho Yin Loke
Attorney, Agent, or Firm—Nola Mae McBain

[57] ABSTRACT

A high current, high voltage transistor which can be easily electrically stacked to extend the voltage range and uses less silicon area than a conventional stacked transistor configuration and a configuration of field plates that provide the greatest breakdown voltages with the highest ohmic values. Also, a star shaped field plate design which provides the greatest breakdown voltages with the highest ohmic values. The field plate is constructed using several concentric rings connected by fingers that are wider at towards the center of the concentric rings and narrower towards the perimeter of the concentric rings.

3 Claims, 7 Drawing Sheets

STACKED HIGH VOLTAGE TRANSISTOR UNIT

BACKGROUND

This invention relates generally to high voltage transistors and more particularly concerns a high voltage electrically stackable NMOS transistor which is fabricated with a "star" shaped field plate that is also a high value high voltage resistor which facilitates electrical stacking of several transistors and thus extend the voltage range for the circuit.

This invention also relates to configurations of field plates that provide the greatest breakdown voltages with the highest ohmic values.

NMOS transistors are lateral devices. In high voltage applications, the transistor is designed to withstand high voltages by constructing a field plate between the gate and drain regions. The field plates space out the equipotential field lines to avoid voltage concentrations. To increase the voltage range of the circuit, it is common to stack several devices in a series configuration. However, when electrically stacking several transistors together, high voltage resistors are needed to set the correct bias potentials at the gates of the several devices. In discrete forms, high voltage components, including high voltage resistors, are very bulky. Even in integrated forms, high voltage resistors are very large. Therefore a large area of silicon is needed to accommodate the high voltage resistors when integrated with high voltage transistors. High voltage devices can be conventionally integrated using well know integrated device processes.

Figure 1:
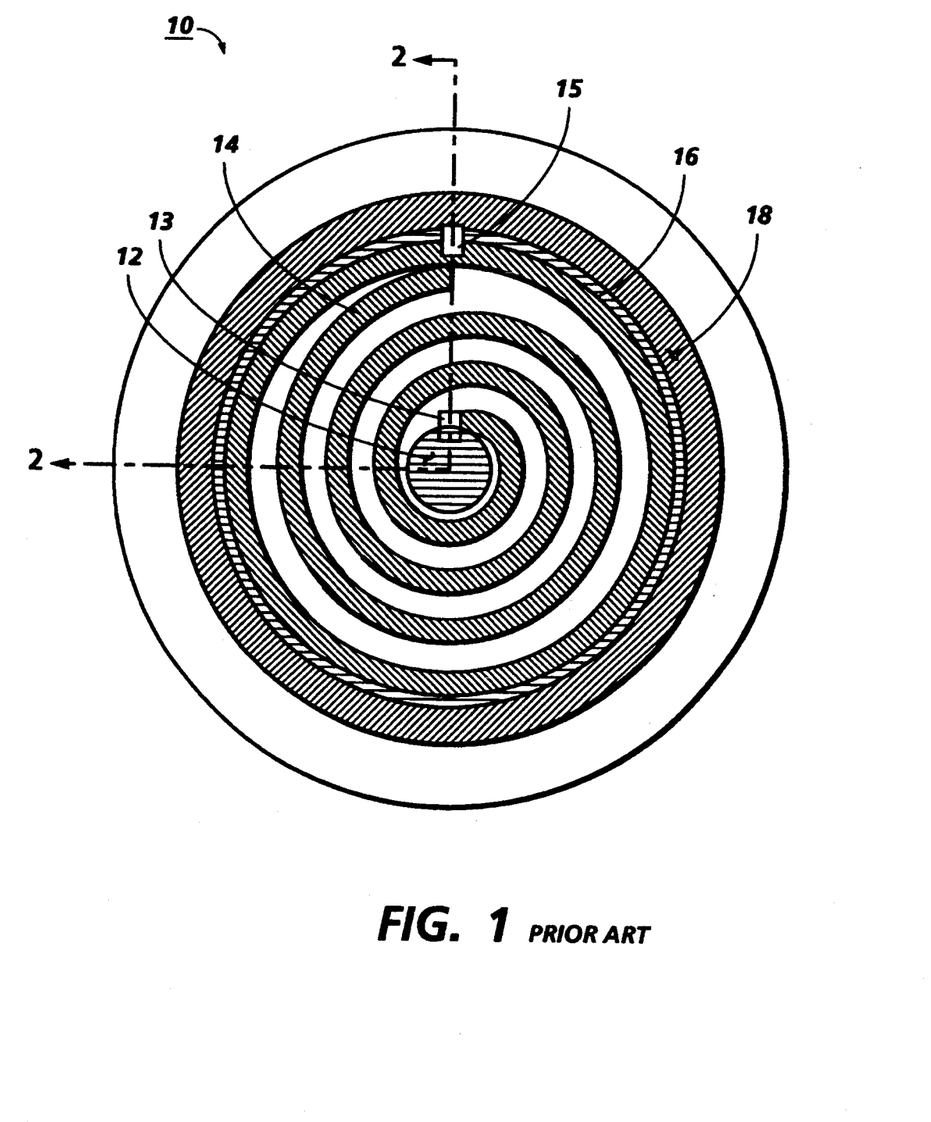
FIG. 1 is a planar view of a conventional high voltage NMOS transistor.

FIG. 1 shows a planar view looking down on a conventional high voltage NMOS device 10. While the preferred embodiment of this device is circular, any annular configuration may be used, for example ellipses. However, it is preferable to avoid geometries with sharp or angular corners. The center of the conventional high voltage NMOS device 10 is a drain area 12. Adjacent to and outside of the drain area 12 is a spiral field plate 14. The spiral field plate 14 is made from polysilicon, which has a high resistance. Adjacent to and outside of the spiral field plate 14 is a gate 16. Adjacent to and outside of the gate 16 is a source area 18. Providing an electronic connection between the drain area 12 and the spiral field plate 14 is a metal drain/field plate connector 13. Providing a connection between the spiral field plate 14 and the gate area 16 is a metal gate/-field plate connector 15.

Figure 2:
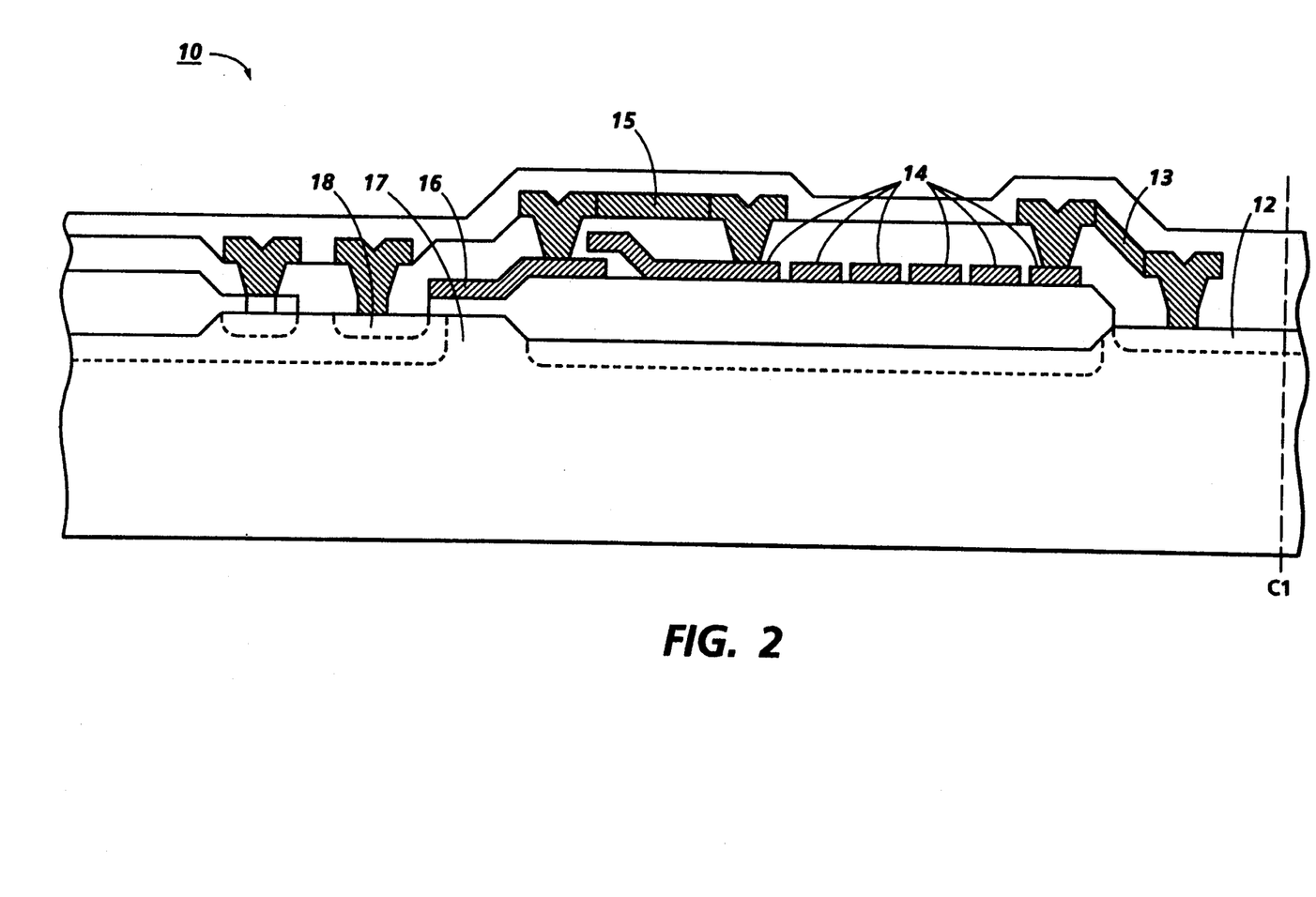
FIG. 2 is a partial cross section of the conventional high voltage NMOS transistor shown in FIG. 1 taken through partial cross-section line 2—2.

FIG. 2 shows a partial cross-section of the high voltage NMOS device 10. Only a partial cross-section is shown since the device is symmetrical across centerline C1. The drain area 12 surrounds the centerline C1. Outside of and adjacent to the drain area 12 is the spiral field plate 14. Providing an electrical connection between the spiral field plate 14 and the drain area 12 is the drain/field plate connector 13. Outside of the spiral field plate 14 is the gate area 17. Providing an electrical connection between the spiral field plate 14 and the gate 16 is the gate/field plate connector 15. Outside of and adjacent to the gate area 17 is the source area 18.

Figure 3:
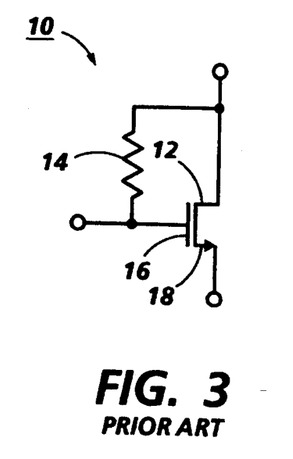
FIG. 3 is a schematic of a the conventional high voltage NMOS device shown in FIG. 1.
Figure 4:
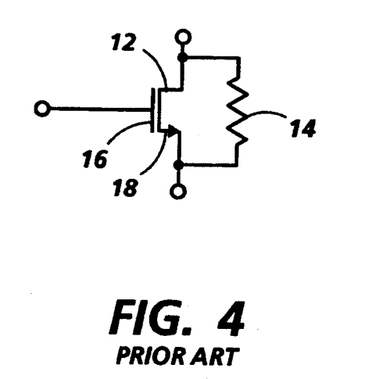
FIG. 4 is an alternate schematic for the conventional high voltage NMOS device shown in FIG. 1.

FIG. 3 shows a schematic of the conventional high voltage NMOS device 10. Identical elements are labeled with the same identifying numbers used in FIG. 1. The drain area 12, gate area 16, and source area 18 are the basic components of the conventional high voltage NMOS device 10. The spiral field plate 14 is represented as a resistor connected between the drain area 12 and the gate 16. Alternatively, the spiral field plate 14 could be connected between the drain area 12 and the source area 18 as shown in FIG. 4.

Figure 5:
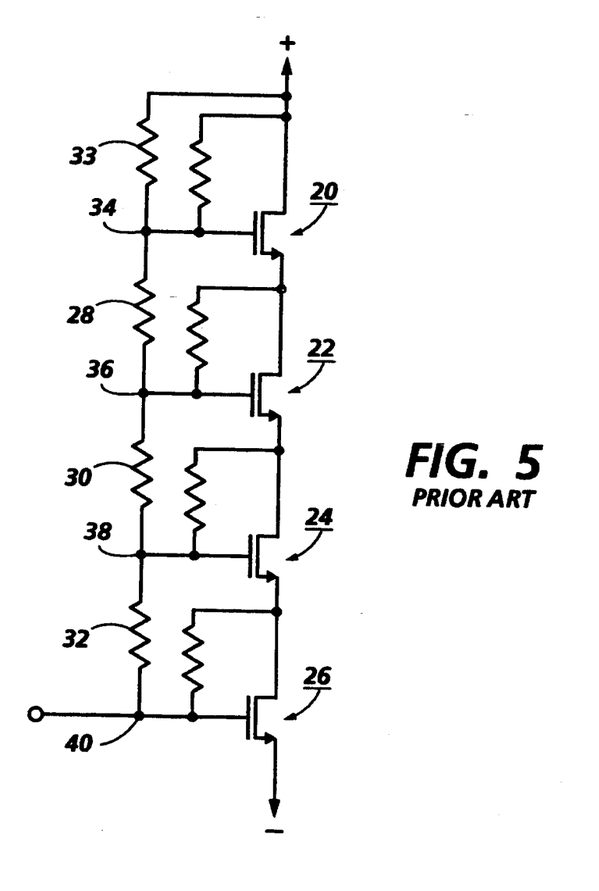
FIG. 5 is a schematic of several conventional high voltage NMOS devices shown in FIG. 3 in a cascaded network.

In some high voltage applications, conventional high voltage NMOS devices 10 are cascaded to extend the voltage range of the resultant device. Such a cascaded electrical series network is shown in FIG. 5 and contains four conventional high voltage NMOS devices 20, 22, 24, 26, although it could be comprised of any number of conventional high voltage NMOS devices. The four high voltage NMOS devices 20, 22, 24, 26 are connected in parallel across a voltage divider network comprised of four resistors 28, 30, 32, 33. Resistor 28 is connected between the gate terminals 34, 36 of high voltage NMOS device 20 and high voltage NMOS device 22. Resistor 30 is connected between the gate terminals 36, 38 of high voltage NMOS device 22 and high voltage NMOS device 24. Resistor 32 is connected between the gate terminals 38, 40 of high voltage NMOS device 24 and high voltage NMOS device 26. Resistor 33 is connected between the gate terminal of high voltage NMOS device 20 and the drain of high voltage NMOS device 20. In order to function properly, the resistors 28, 30, 32, 33 must be constructed as large, high voltage resistors which consume a large part of silicon wafer real estate.

Accordingly, it is the primary aim of the invention to provide a high current, high voltage transistor which can be easily electrically stacked to extend the voltage range of the resultant circuit and uses less silicon area than a conventional electrically stacked transistor configuration.

Another aim of this invention is to provide a configuration of field plates that provide the greatest breakdown voltages with the highest ohmic values.

Further advantages of the invention will become apparent as the following description proceeds.

SUMMARY OF THE INVENTION

Briefly stated and in accordance with the present invention, there is provided a high voltage NMOS transistor which has a built-in high voltage, high value resistor connected to the gate. This resistor performs two functions: 1) to provide a field plate for the transistor, and 2) as part of a resistor divider network to set up a correct bias voltage for another transistor. This dual function transistor facilitates electrical stacking of transistors to extend the voltage range of a resultant circuit.

Also provided in accordance with the present invention is a star shaped field plate design which provides the greatest breakdown voltages with the highest ohmic values. The field plate is constructed using several concentric rings connected by fingers that are wider at towards the center of the concentric rings and narrower towards the perimeter of the concentric rings.

Alpha-Numeric List of Elements c1 centerline
10 high voltage NMOS device
12 drain area
13 drain/field plate connector
14 spiral field plate
15 gate/field plate connector
16 gate
17 gate area
18 source area
20 high voltage NMOS device
22 high voltage NMOS device
24 high voltage NMOS device
26 high voltage NMOS device
28 resistor
30 resistor
32 resistor
33 resistor
34 gate terminals
36 gate terminals
38 gate terminals
40 gate terminals
50 special high voltage NMOS device
52 gate
53 gate terminal
54 drain
55 drain terminal
56 source
57 source terminal
58 resistor
59 gate/field plate connector
60 resistor terminal
62 cascaded network
64 special high voltage NMOS device
66 special high voltage NMOS device
68 special high voltage NMOS device
70 special high voltage NMOS device
72 node
74 node
76 node
78 node
80 node
82 node
84 node
86 resistor
88 resistor
90 resistor
92 resistor
100 special high voltage NMOS device
102 field plate
104 spaced concentric rings
106 radial connecting bands
108 drain
110 pad
112 connection line
114 special high voltage NMOS device
116 field plate
118 fingers
120 rings
122 wide inward end
124 narrow outward end

DETAILED DESCRIPTION OF THE INVENTION

Figure 6:
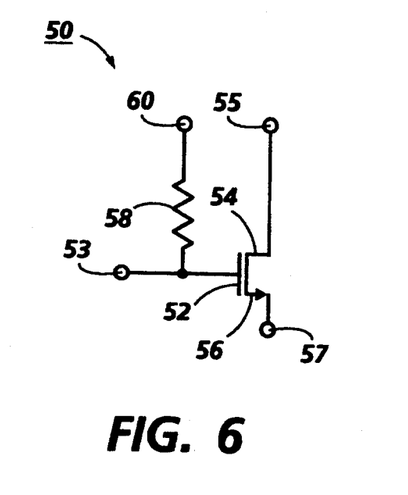
FIG. 6 is a special high voltage NMOS device designed for use in cascaded network.

FIG. 6 shows a schematic of a special high voltage NMOS device 50 designed to be used in a cascaded network. It is similar to the high voltage NMOS device 10 shown in FIG. 3. It has a gate 52 with a gate terminal 53, drain 54 with a drain terminal 55, and a source 56 with a source terminal 57. Connected to the gate 52 and the gate terminal 53 is a large resistor 58. Unlike the high voltage NMOS device 10 which is a three terminal device, the special high voltage NMOS device 50 is a four terminal device. The fourth terminal is a resistor terminal 60 from the resistor 58. The resistor 58 will perform two functions: 1) to provide a field plate for the transistor, and 2) as part of a resistor divider network to set up the correct bias voltage for another transistor. The size of the resistor 58 is between approximately 150 mega ohms and 10 giga ohms.

Figure 7:
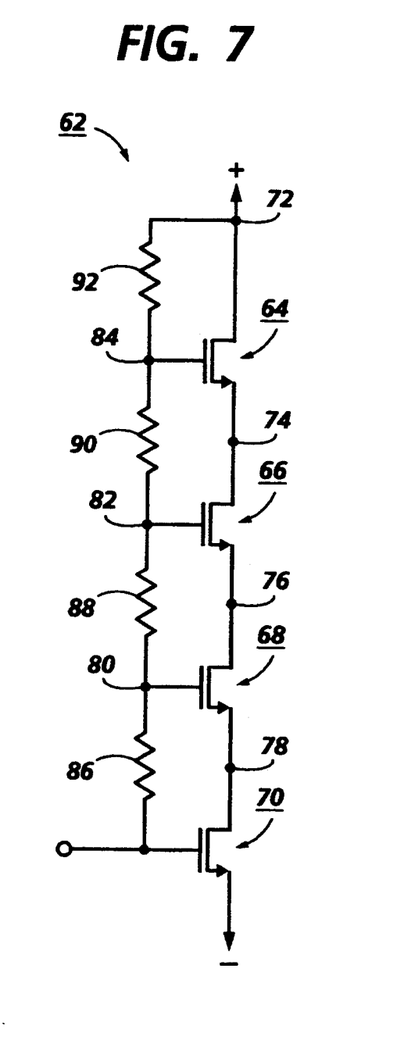
FIG. 7 is a schematic of several high voltage NMOS devices shown in FIG. 6 in a cascaded network.

FIG. 7 shows a cascaded network 62 constructed solely using several special high voltage NMOS devices 64, 66, 68, 70. While this cascaded network is shown utilizing four special high voltage NMOS devices, a cascaded network could be built utilizing any number of special high voltage NMOS devices. Special high voltage NMOS device 64 is connected to special high voltage NMOS device 66 at node 74, which connects the source of special high voltage NMOS device 64 with the drain of special high voltage NMOS device 66. Special high voltage NMOS device 66 is connected to special high voltage NMOS device 68 at node 76 which connects the source of special high voltage NMOS device 66 with the drain of special high voltage NMOS device 68. Special high voltage NMOS device 68 is connected to special high voltage NMOS device 70 at node 78 which connects the source of special high voltage NMOS device 68 with the drain of special high voltage NMOS device 70.

The source of special high voltage NMOS device 70 is attached to the negative node for the circuit.

Resistor 86 of special high voltage NMOS device 70 is connected to the gate of special high voltage NMOS device 68 at node 80. It is this resistor connection that allows the network to be easily and efficiently cascaded since the resistor can now perform two functions simultaneously.

Resistor 86 is now connected between the gates of special high voltage NMOS device 68 and special high voltage NMOS device 70 performing a voltage divider function between the two special high voltage NMOS devices. However, since this is a high voltage application, the special high voltage NMOS device 70 also needs a field plate. In NMOS technology, the field plate is connected between the gate and the drain or the source and the drain, as shown earlier in FIG. 3 and 4, since there is a large voltage difference between the gate and the drain and only a very small difference between the gate and the source.

This new special high voltage NMOS device 50 can take advantage of the small voltage difference between the gate and the source. In a traditional configuration, the resistor 86 should be connected to the drain of special high voltage NMOS device 70 at node 78. However, node 78 is also connected to the source of special high voltage NMOS device 68. Since these are high voltage transistors, the difference between the gate of special high voltage NMOS device 68 at node 80 and the source of special high voltage NMOS device 68 at node 78 is small and can be ignored. Therefore, when the resistor 86 is connected to node 80 instead of node 78, it is still properly biased to perform its function as a field plate for special high voltage NMOS device 70. The cascaded electrical series network 62 is thus simplified and space is saved because resistor 86 performs two functions. The first function is as a voltage divider between the gates of special high voltage NMOS device 68 and special high voltage NMOS device 70. The second function is as a field plate for special high voltage NMOS device 70.

The rest of the circuit is connected in a similar way. Resistor 88 is connected between the gates of special high voltage NMOS device 68 and special high voltage NMOS device 66 at node 80 and node 82 respectively. Resistor 88 performs the voltage divider function between the gates of special high voltage NMOS device 68 and special high voltage NMOS device 66 as well as the field plate function for special high voltage NMOS device 68. Resistor 90 is connected between the gates of special high voltage NMOS device 66 and special high voltage NMOS device 64 at node 82 and node 84 respectively. Resistor 90 performs the voltage divider function between the gates of special high voltage NMOS device 66 and special high voltage NMOS device 64 as well as the field plate function for special high voltage NMOS device 66. Since there are no further transistors, resistor 92 of special high voltage NMOS device 64 is connected back to the drain of special high voltage NMOS device 64 at node 72 a positive node as done in the conventional manner. As the special high voltage NMOS device 50 is a four terminal device, it is important to remember to connect the resistor of the last transistor to that transistors drain so that the resistor can perform its function as a field plate.

In the example shown in FIG. 7, four special high voltage NMOS devices 64, 66, 68, 70 were cascaded to create the cascaded electrical series network 62. It is important to note, that in creating the cascaded electrical series network 62 that any n+1, where n is an integer of at least 1, number of special high voltage NMOS devices 50 could be used depending on the requirements of the resultant cascaded electrical series network 62. Four special high voltage NMOS devices 64, 66, 68, 70 were used merely to illustrate the principles behind cascading special high voltage NMOS devices 50 to create a cascaded electrical series network 62.

Figure 8:
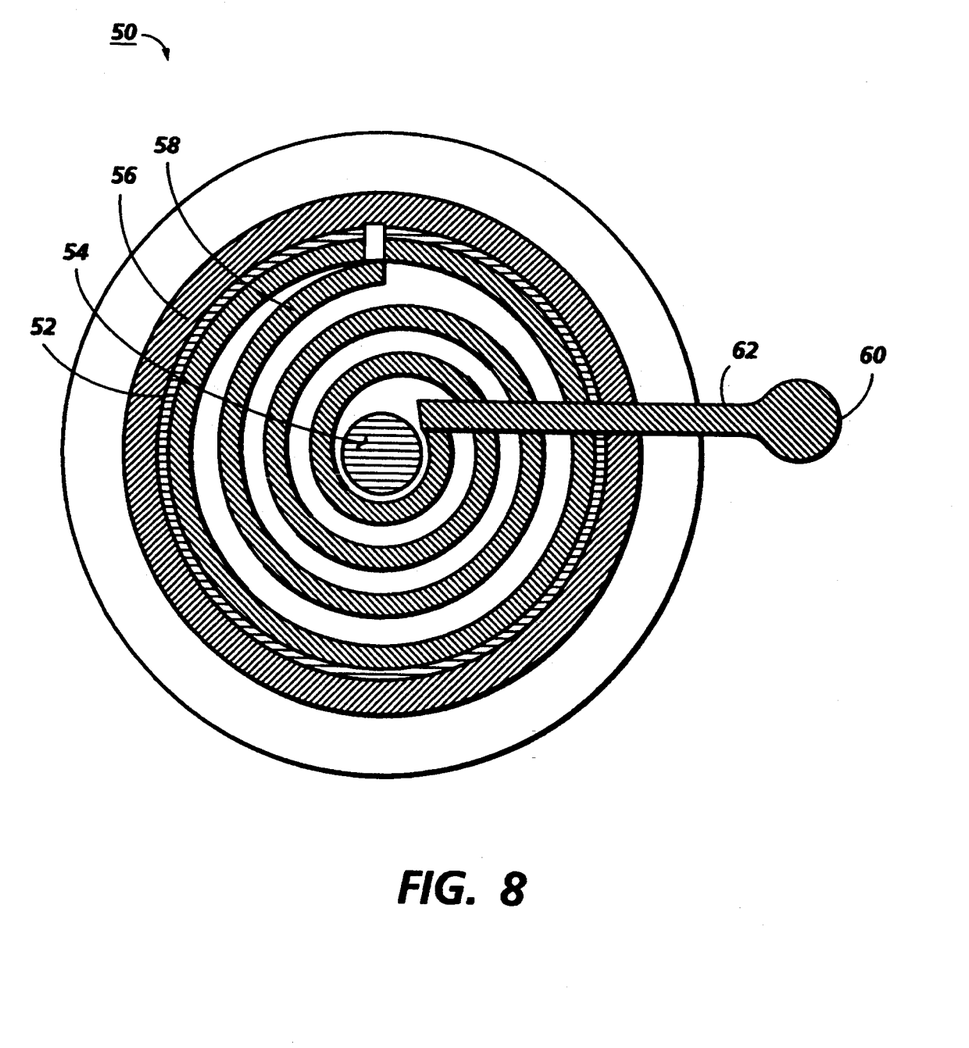
FIG. 8 is a planar view of a special high voltage NMOS device designed for use in cascaded network shown in FIG. 6 using a spiral resistor.

FIG. 8 shows a planar view of the special high voltage NMOS device 50 shown in FIG. 6. Since conventional processes were used to create the special high voltage NMOS device 50 attention will be focused on the layout of the special high voltage NMOS device 50. The special high voltage NMOS device 50 is similar to the high voltage NMOS device 10 in many respects. The innermost region is the drain 54. Outside of the drain 54 is the resistor 58 which will serve two functions, as a field plate and as part of a voltage divider network when the special high voltage NMOS devices 50 are cascaded. Outside of the resistor 58 is the gate 52. Outside of the gate 52 is the source 56. There is a gate/field plate connector 59 to provide an electrical connection between the gate 52 and the resistor 58. However, the drain/field plate connector 13 shown in the high voltage NMOS device 10 in FIG. 1 has been replaced with a pad 60 and metal line 62 to provide access to the resistor 58. There is no connection between the drain 54 and the resistor 58 in the special high voltage NMOS device 50. The resistor 58 must be connected to either the gate 52 of another special high voltage NMOS device 50 in a cascaded fashion or, in the case of the terminating transistor of a cascaded electrical series network, back to the special high voltage NMOS device's 50 own drain 54 in order for the transistor to work properly. The regions occupied by the drain 54, gate 52, source 56, and resistor 58 are shown as annular concentric regions but could easily be ovals or some other shape as long as the regions surround each in a concentric fashion.

While the previous examples have focused on NMOS technology, the concept of using a resistor in the dual role of both transistor field plate and as part of a voltage divider network of cascaded devices is applicable to both PMOS and bipolar technology.

Figure 9:
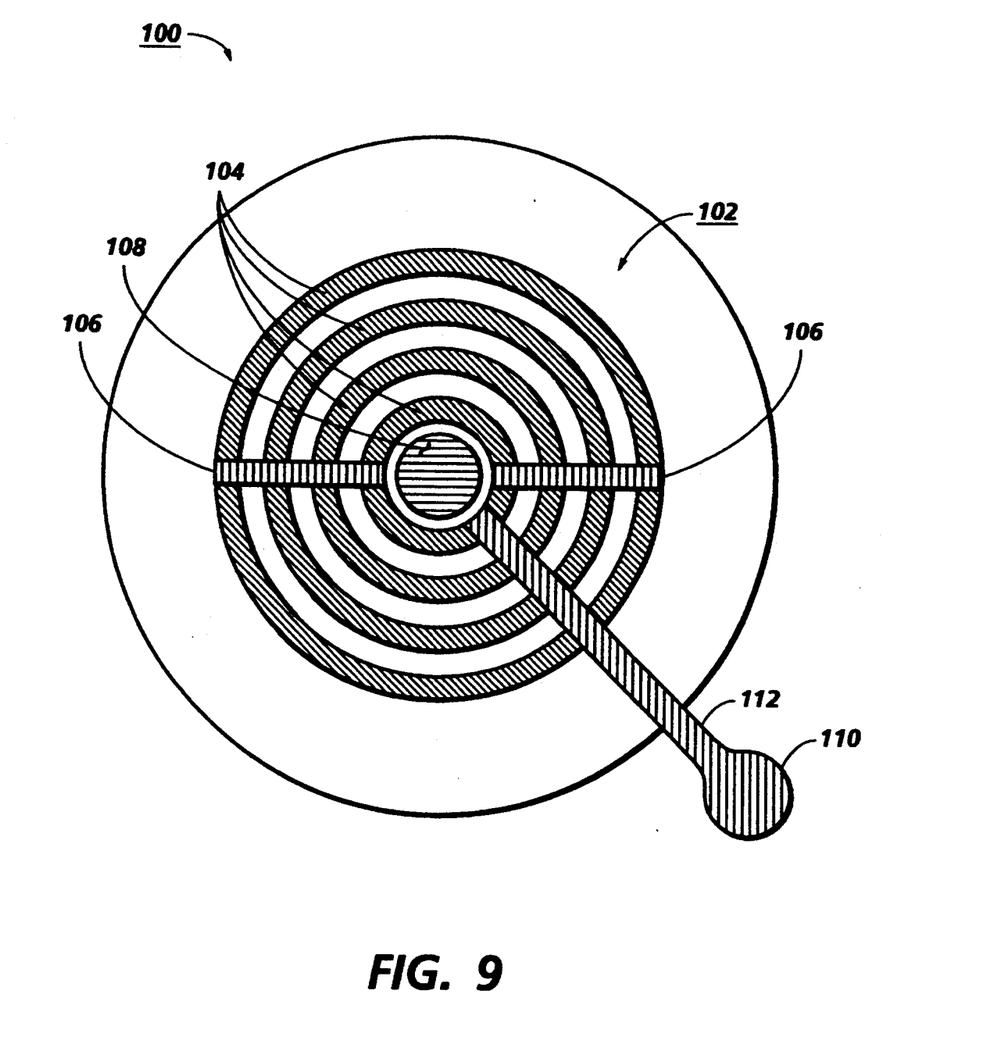
FIG. 9 is an alternate planar view of a special high voltage NMOS device designed for use in cascaded network shown in FIG. 6 using a resistor comprised of concentric rings.

The technique of using a field plate as a large resistor with a dual function, is applicable to high voltage transistors with field plate configurations other than spirals. FIG. 9 shows another special high voltage NMOS device 100 with another common field plate 102 construction, that of joined concentric rings. The field plate 102 is comprised of several spaced concentric rings 104 connected by two radial connecting bands 106. A drain 108 is located inside and spaced apart from the innermost of the spaced concentric rings 104. There is no electrical connection between the drain 108 and the field plate 102. A pad 110 and metal connection line 112 provide a connecting point to the innermost of the spaced concentric rings 104. The rest of the special high voltage NMOS device 100 is constructed in a conventional manner and is not shown.

Both spiral field plates and concentric ring field plates have their own intrinsic advantages and disadvantages. For example, high voltage devices made with spiral field plates, as shown in FIGS. 1 and 8, have a greater break down voltage. However fabrication is easier and it is possible to make resistors with larger ohmic values using the concentric ring method as shown in FIG. 9. It would be desirable to find a field plate construction that combines the advantages of spiral field plates and concentric ring field plates.

Figure 10:
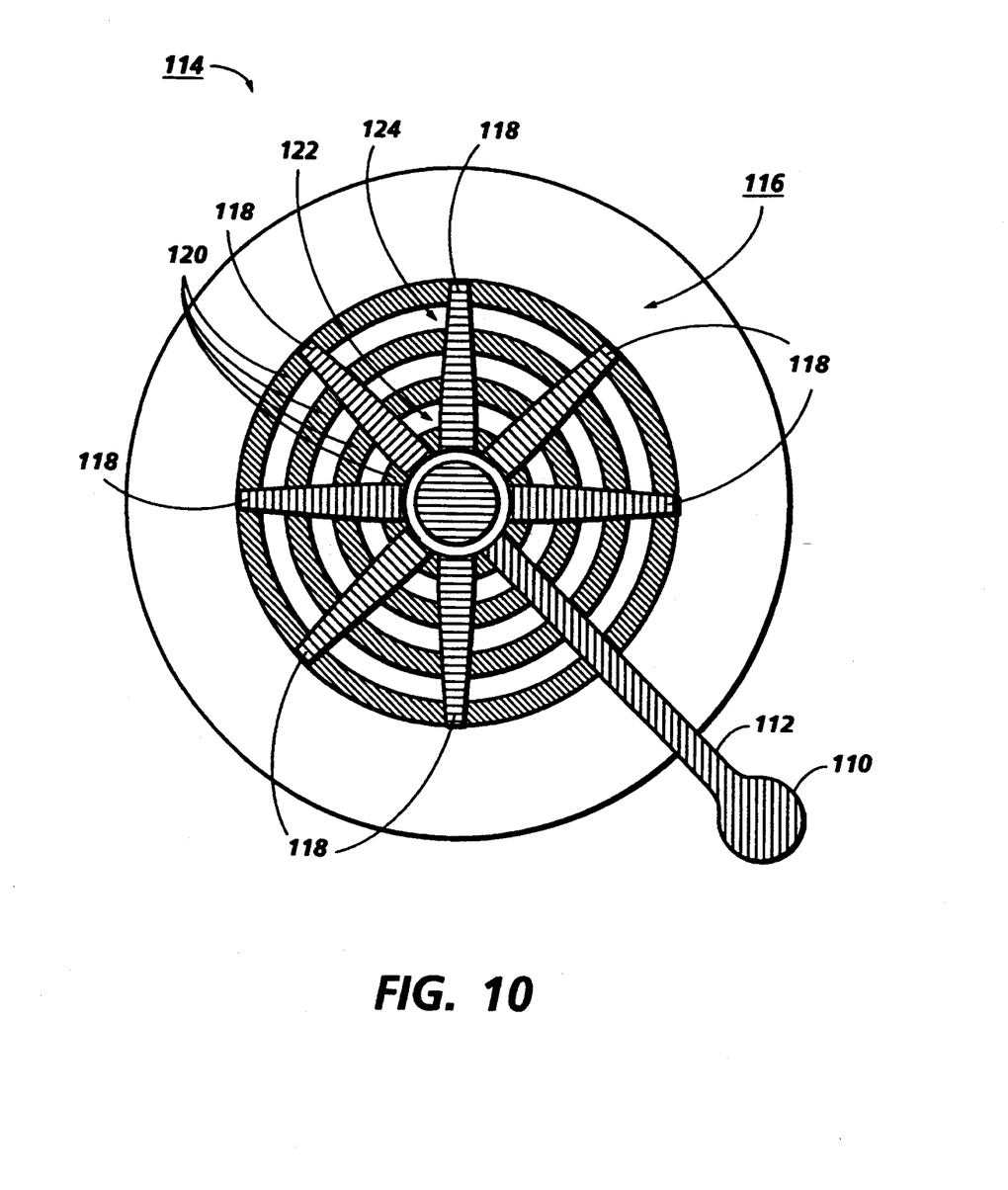
FIG. 10 is an alternate planar view of a special high voltage NMOS device designed for use in cascaded network shown in FIG. 6 using a star shaped resistor network.

FIG. 10, shows a portion of a special high voltage NMOS device 114 with a field plate 116. The field plate 116 comprises fingers 118 and rings 120, resulting in a "star" construction. In comparing FIG. 10 with FIG. 9, the radial connecting bands 106 used in FIG. 9 are replaced by fingers 118 used in FIG. 10.

Focusing on the fingers 118, the fingers 118 have a wide inward end 122 and a narrow outward end 124. Designing a field plate using a series of concentric rings 120 connected with radial fingers 118 facilitates a field plate with the advantages of both spiral field plates, as shown in FIG. 8 and ring field plates, as shown in FIG. 9. The wide inward end 122 of the fingers 118 provides a physically larger connection between the fingers 118 and the rings 120 where the voltage concentration is the largest. This allows the field plate 116 to more effectively space the equipotential lines. The narrow outward end 124 of the fingers 118 provides a physically smaller connection where the voltage concentration is the smallest. For most efficient operation, the ratio of the width of the wide inward end 122 to the width of the narrow outward end 124 should be approximately 2:1.

The rings 120 can be constructed out of a medium resistance polysilicon, typically having values of 10 kilo ohms per square. The rings 120 are fabricated using the same techniques and materials used to produce the spaced concentric rings 104 shown in the special high voltage NMOS device 100 in FIG. 9. It is this feature which facilitates production of very high ohmic resistors. Typical values range from 150 mega ohms to 10 giga ohms.

The fingers are constructed of a high resistance polysilicon, typically having values of 2 gigia ohms per square. The number of fingers 118 needed is dependent upon the size of the resistor desired. A very large resistor of approximately 10 giga ohms would only need 1 finger 118. The number of fingers increases inversely with resistor size. A much smaller resistor of 150 mega ohms would need 50 fingers 118. If more than one finger 118 is needed they should be approximately evenly spaced around the circumference of the rings 120. FIG. 10 shows a configuration including 7 fingers 118 for illustration purposes only.

While a field plate constructed in either a ring structure, as shown in FIG. 9, a spiral structure, as shown in FIG. 8, or a star structure, as shown in FIG. 10, can be used to construct the special high voltage NMOS device 50, the star structure shown in FIG. 10 has provided the best results because the unique design of the star structure combines very large resistor characteristics of the traditional concentric ring design with the higher breakdown voltages found in spiral designs.

We claim:

1. A high voltage cascaded network circuit comprising:
   a) an electrical circuit of two four terminal high voltage transistors, one of the two transistors being a first transistor in the electrical circuit and the other transistor being a second transistor in the electrical circuit, each transistor comprising:
      i) a source region, a drain region, a gate region, and a resistor region,
      ii) said drain region, said resistor region, said gate region, and said source region being arranged in a concentric configuration with said drain region being the innermost region, said resistor region surrounding said drain region, said gate region surrounding said resistor region, and said source region surrounding said gate region,
      iii) a source having a source terminal, said source being located in said source region,
      iv) a drain having a drain terminal, said drain being located in said drain region,
      v) a gate having a gate terminal, said gate being located in said gate region,
      vi) a resistor terminal, and
      vii) a resistor means having two ends, said resistor means being located in said resistor region, one end of said resistor means being electrically connected to said gate terminal and the other end of said resistor means being electrically connected to said resistor terminal,
   b) a positive node,
   c) a negative node,
   d) said source terminal of said first transistor being electrically connected to said negative node,
   e) said resistor terminal and said drain terminal of said second transistor being electrically connected to said positive node,
   f) said drain terminal of said first transistor being electrically connected to said source terminal of said second transistor, and
   g) said resistor terminal of said first transistor being electrically connected to said gate terminal of said second transistor.

2. A high voltage cascaded network circuit comprising:
   a) an electrical circuit of a plurality of four terminal high voltage transistors electrically connected to each other in a sequential order, one of said transistors being a first transistor in the electrical circuit and another of said transistors being a last transistor in the electrical circuit, each transistor comprising:
      i) a source region, a drain region, a gate region, and a resistor region,
      ii) said drain region, said register region, said gate region, and said source region being arranged in a concentric configuration with said drain region being the innermost region, said resistor region surrounding said drain region, said gate region surrounding said resistor region, and said source region surrounding said gate region,
      iii) a source having a source terminal, said source being located in said source region,
      iv) a drain having a drain terminal, said drain being located in said drain region,
      v) a gate having a gate terminal, said gate being located in said gate region,
      vi) a resistor terminal, and
      vii) a resistor means having two ends, said resistor means being located in said resistor region, one end of said resistor means being electrically connected to said gate terminal and the other end of said resistor means being electrically connected to said resistor terminal,
   b) a positive node,
   c) a negative node,
   d) said source terminal of said first transistor being electrically connected to said negative node,
   e) said resistor terminal and said drain terminal of said last transistor being electrically connected to said positive node, and
   f) each of said transistors other than said first and said last transistors having:
      i) its drain terminal electrically connected to said source terminal of its respective succeeding transistor in said sequential order,
      ii) its resistor terminal electrically connected to said gate terminal of its respective succeeding transistor in said sequential order,
      iii) its source terminal electrically connected to said drain terminal of its respective preceeding transistor in said sequential order, and
      iv) its gate terminal electrically connected to said resistor terminal of its respective preceeding transistor in said sequential order.

3. A high voltage cascaded network circuit comprising:

a) an electrical circuit of n+1 four terminal high voltage transistors, n being an integer of at least two, each of said transistors being uniquely numbered with an integer i between one and n+1 inclusive, said transistor being numbered one being a first transistor in the electrical circuit and said transistor numbered n+1 being a last transistor in the electrical circuit, each transistor comprising:
  i) a source region, a drain region, a gate region, and a resistor region,
  ii) said drain region, said resistor region, said gate region and said source region being arranged in a concentric configuration with said drain region being the innermost region, said resistor region surrounding said drain region, said gate region surrounding said resistor region, and said source region surrounding said gate region,
  iii) a source having a source terminal, said source being located in said source region,
  iv) a drain having a drain terminal, said drain being located in said drain region,
  v) a gate having a gate terminal, said gate being located in said gate region,
  vi) a resistor terminal, and
  vii) a resistor means having two ends, said resistor means being located in said resistor region, one end of said resistor means being electrically connected to said gate terminal and the other end of said resistor means being electrically connected to said resistor terminal,
b) a positive node,
c) a negative node,
d) said source terminal of said first transistor being electrically connected to said negative node,
e) said resistor terminal and said drain terminal of said drain of said last transistor being electrically connected to said positive node, and
f) each of said number i transistors where i is every integer starting with 1 up through n, having: its drain terminal electrically connected to said source terminal of said transistor numbered (i+1) in the electrical circuit, and
  ii) its resistor terminal electrically connected to said gate terminal of said transistor numbered (i+1) in the electrical circuit.

* * * * *